United States Patent [19]

Hart et al.

[11] 4,393,471

[45] Jul. 12, 1983

[54] MEMORY CELL ARRANGEMENT FOR A STATIC MEMORY

[75] Inventors: Cornelis M. Hart; Jan Lohstroh, both of Eindhoven, Netherlands

[73] Assignee: U.S. Philips Corporation, New York, N.Y.

[21] Appl. No.: 205,816

[22] Filed: Nov. 10, 1980

[30] Foreign Application Priority Data

Nov. 15, 1979 [NL] Netherlands .......................... 7908340

[51] Int. Cl.³ .............................................. G11C 11/40

[52] U.S. Cl. ...................................... 365/154; 365/189

[58] Field of Search ............... 365/154, 155, 156, 189, 365/230

[56] References Cited

U.S. PATENT DOCUMENTS 3,990,056 11/1976 Luisi et al. .......................... 365/154

*Primary Examiner*—Terrell W. Fears

*Attorney, Agent, or Firm*—Steven R. Biren; Robert T. Mayer

[57] ABSTRACT

A memory cell for a static memory, in which the number of control lines is reduced to a maximum of three by the use of a diode in one collector circuit and the series connection of a diode and a resistor in the other collector circuit of an Eccles-Jordan flip-flop, which diodes have an exponential characteristic with an exponent smaller than that of conventional diodes.

6 Claims, 5 Drawing Figures

X1
VX
3
5
4
6
A
1
2
VY
X2
IX
Y

MEMORY CELL ARRANGEMENT FOR A STATIC MEMORY

BACKGROUND OF THE INVENTION

The invention relates to a memory cell arrangement for a static memory, realized in integrated circuit technology, which is provided with a number of control lines for writing, reading and retaining the memory information in the cell, which cell comprises two cross-coupled transistors which are connected to the control lines.

It is specifically the object of the invention to reduce the number of control lines of such a cell in order to save area on the semiconductor body on which the memory is integrated. Generally, two pairs of control lines per cell are required, namely two word lines and two bit lines, by means of which information can be written into, read out of or retained in such a cell. The German "Auslegeschrift" No. 2,147,833, in FIG. 8 et seq, reveals examples which employ only three control lines per cell, but in practice such memories are found not to perform satisfactorily, because during stand-by of such a cell a current flows through the bit lines (DL), so that in the case of a large number of cells a parasitic current may flow which is so large that incorrect information may be obtained when a selected cell is read.

SUMMARY OF THE INVENTION

The invention is characterized in that the cell is connected to at the most three control lines, at least one control line being connected to the collector of the one transistor of the cell via a first diode and to the collector of the other transistor of the cell via the series connection of a resistor and a second diode, said diodes having an exponential current-voltage characteristic with the exponent (qV)/(mkT), where q represents the elementary charge, V the voltage, k Boltzmann's constant, T the absolute temperature and m a constant greater than 1.

The invention proceeds from concepts set forth in the previous Patent Application, published as GB 2038091, which has not yet been laid open to public inspection, in accordance with which significant advantages of the use of such diodes are that the stand-by mode of the cell is substantially independent of the current through the cell and is thus sustained at a very low current setting, while the technological realization of such diodes presents few problems, for example by use of a polycrystalline semiconductor material. The use of said resistor in series with a diode enables the use of only three lines, as will become apparent hereinafter.

BRIEF DESCRIPTION OF THE DRAWINGS

The invention will be described in more detail with reference to the drawings, in which.

DESCRIPTION OF THE PREFERRED EMBODIMENTS

Figure 1:
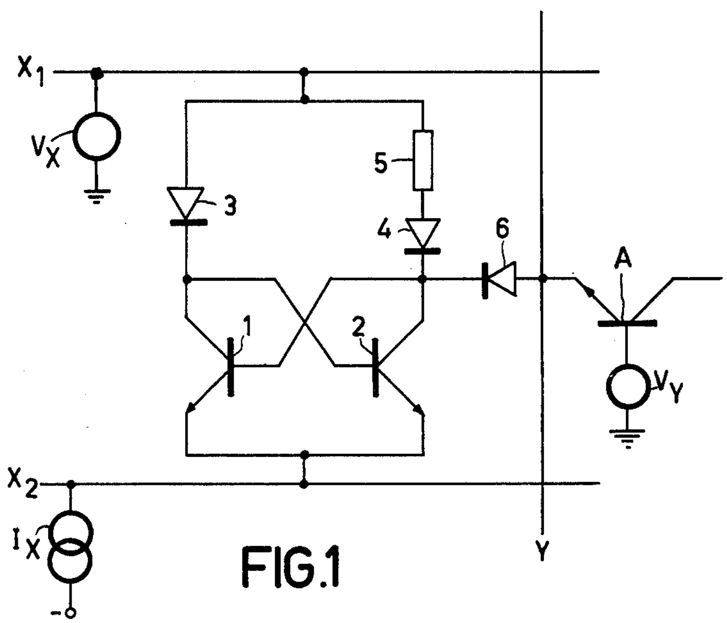
FIG. 1 represents a first embodiment of the invention.

The cell of FIG. 1 comprises two transistors 1 and 2, whose collectors and bases are cross-coupled, so that an Eccles-Jordan flip-flop is obtained. This cell is controlled by means of three control lines, namely two words lines $x_1$ and $x_2$ and one bit line y. The control line $x_1$ is connected to a control voltage source $V_x$, the line $x_2$ to a control current source $I_x$, while the bit line y is connected to a current detector, for example in the form of a transistor A, whose collector output provides the current that flows in the line y, a control voltage source $V_y$ enabling a desired control potential to be impressed on the line y.

The collector circuit of the transistor 1 includes a first diode 3 and that of the transistor 2 includes the series-connection of a second diode 4 and a resistor 5. The control line $x_1$ is connected to the collector of transistor 1 via the diode 3 and to the collector of transistor 2 via the said series connection. Furthermore, the control line $x_2$ is connected to the emitters of transistors 1 and 2, while the control line y is connected to the collector of the transistor 2 via a diode 6. All of the diodes 3, 4 and 6 have exponential current-voltage characteristics with an exponent (qV)/(mkT), in which m is greater than 1, which is technologically feasible by using junctions of polycrystalline and monocrystalline semiconductor materials, of two polycrystalline materials of opposite conductivity types, or of "punch-through" diodes. It is alternatively possible to simulate one such diode by a plurality of conventional diodes in series, but this will demand more area on the semiconductor body on which the cell is integrated.

For writing a logic 1, a voltage of for example 0 V is impressed on the line $x_1$ and a voltage of +1 V on the line y, the current source $I_x$ connected to the line $x_2$ supplying a comparatively large current. This current then sees two parallel paths, namely the series-connection of the emitter-base path of the transistor 1 and the diode 6 and the series connection of the emitter-base path of the transistor 2 and the diode 3, the branch 4–5 remaining substantially nonconductive. As the control line y carries a higher voltage than the control line $x_1$, a greater proportion of the current from the source $I_x$ will take the first-mentioned path 1–6 and will turn on transistor 1 and virtually turn off transistor 2.

For writing a logic 0, a voltage of for example −1 V is impressed on the y-line, while the line $x_1$ is for example again at a voltage of 0 V and the line $x_2$ supplies a comparatively large current, the internal resistance of the diodes 3 and 4 respectively being lower than the resistance 5. Diode 6 will now conduct substantially no current, so that the current path constituted by the series-connection of the emitter-base path of the transistor 1, the diode 4, and the resistor 5 will present a substantially higher resistance than the series-connection constituted by the emitter-base path of the transistor 2 and the diode 3. Consequently, the transistor 2 will conduct and the transistor 1 will be cut off.

For retaining information, the line $x_1$ is for example set to +2 V, while the line $x_2$ is set to a lower current level. The line y is for example at a voltage of 0 V, so that the diode 6 is cut off. At a low current level the flip-flop 1–2 thus operates as a normal flip-flop, for which it is important that the internal resistance of the diodes 3 and 4 (which is then high relative to the resistance 5) increases to the same extent as the inverse transconductance of the transistors 1 and 2 respectively, so that the stand-by mode of the cell is substantially independent of the bias current (since said factor m is greater than 1, for example 1.5 to 2, the loop gain of the flip-flop will be substantially greater than 1, namely 3 to 4), enabling the use of a small stand-by current, thereby providing an economical circuit.

For reading the cell, the lines $x_1$ and y are set to the same potential, for example 0 V, and the source $I_x$ to a larger current. Depending on whether transistor 1 or 2 conducts, the current in line y will be comparatively large or small, which can be determined by means of the current detector A.

Figure 2:
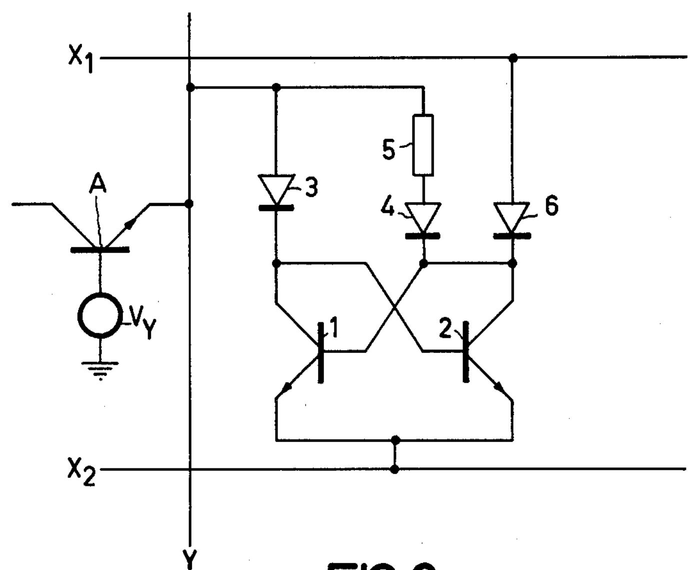
FIGS. 2, 3 and 4 represent alternate embodiments of the invention.

In the embodiment of FIG. 2, the lines $x_1$ and y have been interchanged. The reference numerals are the same as in FIG. 1. The operation is similar to that of the circuit of FIG. 1, except that during read-out the stand-by currents of the other cells which are connected to the y-line also flow through this line.

Figure 3:
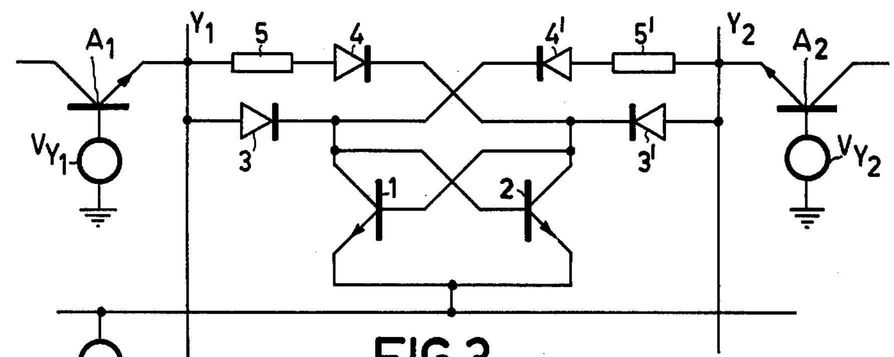

In the embodiment of FIG. 3, the cell of FIG. 1 is symmetrical. For writing information the source $I_x$ is again set to a comparatively large current, the state of the flip-flop being dependent on the voltage difference between the sources $V_{y1}$ and $V_{y2}$. For reading, the source $I_x$ is set to a comparatively large current and the two lines $y_1$ and $y_2$ are brought at the same potential by means of the sources $V_{y1}$ and $V_{y2}$ respectively, so that via the current detectors $A_1$ and $A_2$ respectively a difference current is produced which depends on the state of the flip-flop. For retaining the information, the source $I_x$ is set to a comparatively small current. As the values of the resistors 5 and 5' may then practically be ignored relative to the internal resistance of the diodes 4 and 4' respectively, a stable stand-by mode is guaranteed despite the low current setting, spurious writing operations being impossible, because the cell is always energized by the y-line with the higher potential.

Figure 4:
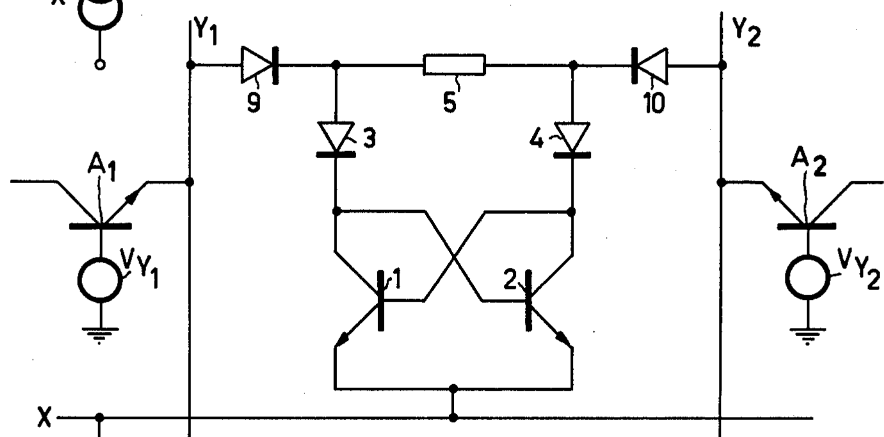

In the embodiment of FIG. 4 the two branches corresponding with 3–4–5 of FIG. 1 are interlaced, i.e. the bit line $y_1$ is connected to the collector of the one transistor 1 via the diode 3 and to the collector of the other transistor 2 of the flip-flop 1 via the series connection of the resistor 5 and the diode 4. Similarly, the bit line $y_2$ is connected to the collector of the transistor 2 via the diode 4 and to the collector of the transistor 1 via the series connection of the resistor 5 and the diode 3. The diodes 3 and 4 are again of the type with an exponential current-voltage characteristic with the exponent (qV)/mkT), where m is greater than 1. The isolating diodes 9 and 10 included between the respective lines $y_1$ and $y_2$ and the junction points 3–5 and 4–5 respectively may have arbitrary diode characteristics. Writing, reading and retaining information are again achieved as described with reference to FIG. 3, parasitic writing operations again being precluded because in the stand-by mode the cell remains always energized by the y-line, which is at the higher potential.

Figure 5:
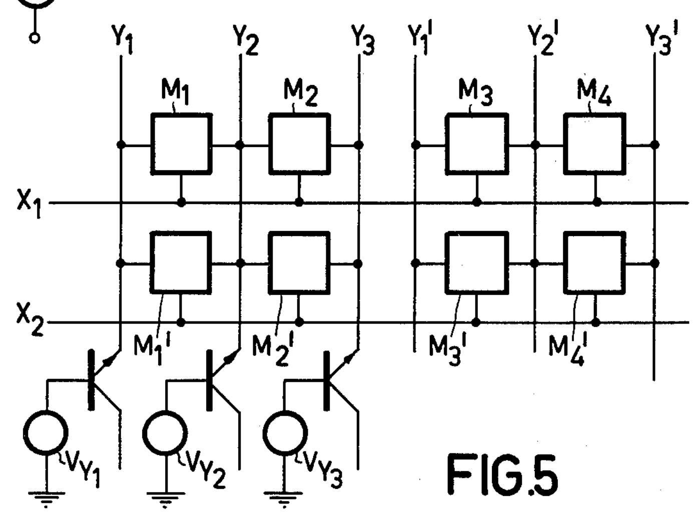
FIG. 5 represents a static memory employing the storage devices of FIG. 3 or 4.

FIG. 5 shows an example of a random access memory with rows and column of memory cells, each of the blocks M representing a memory cell in accordance with FIG. 3 or 4. The cell $M_1$ is controlled by means of the word line $x_1$ and the two bit lines $y_1$ and $y_2$, while the cell $M_2$ is controlled by means of the word line $x_1$ and the two bit lines $y_2$ and $y_3$. Thus, the bit line $y_2$ is common to the cells $M_1$ and $M_2$ ($M_1'$ and $M_2'$ respectively, etc.), which means an additional saving of control lines, because now only four control lines are required for every two cells. For writing information into the cell $M_1$ the line $y_1$ is either brought to a positive voltage, for example +1 V (logic 1) or to a negative voltage of for example −1 V (logic 0) relative to the line $y_2$ (for example 0 V), while the line $x_1$ is set to a comparatively large current. Reading is also effected by setting $x_1$ to a comparatively large current and $y_1$ and $y_2$ to the same potential, for example 0 V. In order to preserve the information in the memory, $y_1$ and $y_2$ are again set to equal potentials, for example 0 V, and $x_1$ to a comparatively large current.

In accordance with an alternate embodiment, the bit lines of adjacent pairs may be commoned, so that for example the lines $y_3$ and $y_1'$ coincide. This results in a further saving of area in the case of integration, but this is at the expense of more intricate voltage settings of the sources $V_y$ which control the bit lines.

What is claimed is:

1. A memory-cell arrangement for a static memory, realized in integrated circuit technology, which is provided with a number of control lines for writing, reading and retaining the memory information in the cell, which cell comprises two cross-coupled transistors which are connected to the control lines, characterized in that the cell is connected to at most three control lines, at least one control line being connected to the collector of the one transistor of the cell via a first diode and to the collector of the other transistor of the cell via the series connection of a resistor and a second diode, said diodes having an exponential current-voltage characteristic with the expoenent (qV)/(mkT), where q represents the elementary charge, V the voltage, k Boltzmann's constant, T the absolute temperature and m a constant greater than 1.

2. An arrangement as claimed in claim 1, characterized in that the emitters of the two transistors are connected to a control current source, which, in the stand-by mode during which information is to be retained in the cell, supplies such a small current that said resistance is low relative to the internal resistance of the first and the second diode respectively, while in the read and the write mode of the cell said control current source supplies such a large current that said resistance at least approximates to said internal resistance.

3. An arrangement as claimed in claim 2, characterized in that the collector of said other transistor is connected to a control line via a diode, which control line is connected to a current detector for reading memory information.

4. An arrangement as claimed in claim 3, characterized in that the arrangement comprises two such control lines, the control line being connected to the collector of the one transistor via said first diode and to the collector of the other transistor of the cell via said series-connection, while the other control line is connected to the collector of the other transistor via a similar diode and to the collector of the one transistor of the cell via a similar series connection.

5. An arrangement as claimed in claim 3, characterized in that the arrangement comprises two such control lines, a first isolating diode being included between the one control line and the junction point of said first diode and said series connection, while a second isolating diode is included between the other control line and the junction point of said resistor and said second diode.

6. A static memory with rows and columns of memory cells as claimed in claim 4 or 5, characterized in that adjacent cells connected to the same word line employ a common control line.

* * * * *

UNITED STATES PATENT AND TRADEMARK OFFICE

CERTIFICATE OF CORRECTION

PATENT NO. : 4,393,471

DATED : July 12, 1983

INVENTOR(S) : CORNELIS MARIA HART ET AL

It is certified that error appears in the above—identified patent and that said Letters Patent is hereby corrected as shown below:

Column 4, line 49, claim 4, "the" should be --one--

Signed and Sealed this

*Thirteenth* Day of *September 1983*

[SEAL]

*Attest:*

GERALD J. MOSSINGHOFF

*Attesting Officer* *Commissioner of Patents and Trademarks*